United States Patent [19]

Pascaru

[11] Patent Number: 5,107,226
[45] Date of Patent: Apr. 21, 1992

[54] ATOMIC FREQUENCY STANDARD USING OPTICAL PUMPING FOR STATE PREPARATION AND MAGNETIC STATE SELECTION OF ATOMS

[75] Inventor: Iancu Pascaru, Great Neck, N.Y.

[73] Assignee: Frequency Electronics, Inc., Mitchell Field, N.Y.

[21] Appl. No.: 648,149

[22] Filed: Jan. 30, 1991

[51] Int. Cl.$^5$ .............................................. H03L 7/26
[52] U.S. Cl. ......................................... 331/3; 331/94.1
[58] Field of Search .................................. 331/94.1, 3

[56] References Cited

U.S. PATENT DOCUMENTS 2,972,115  2/1961  Zacharias et al. ...................... 331/3
4,684,900  8/1987  Avila et al. ............................. 331/3

OTHER PUBLICATIONS

"A Cesium Beam Atomic Clock Using Laser Optical Pumping Preliminary Tests," by M. Arditi et al., Journal de Physiques Letters, No. 16, pp. 379–381, 1980.

"Optical Pumping by Lasers in Atomic Frequency Standards," by L. L. Lewis et al., 35th Annual Symposium on Frequency Control, Philadelphia, Pa., p. 612, 1981.

"Optically Pumped Small Cesium Beam Standards: A Status Report," by Amy Derbyshire et al., 39th Annual Symposium on Frequency Control, No. 18, 1985.

"Microwave Ramsey Resonances from a Laser Diode Optically Pumped Cesium Beam Resonator," by G. Avila et al., IEEE Trans. Instr. Meas., IM-34, p. 139, 1985.

"An Optically Pumped Cesium Beam Frequency Standard for Military Applications," by T. McClelland et al., 41st Annual Symposium on Frequency Control S9, 1987.

"Calculations on the Efficiency of Optical Pumping of a Cesium Atomic Beam by Lasers of Finite Linewidth," by C. Jacques et al., 42nd Annual Symposium of Frequency Control, pp. 505–509, 1988.

"Molecular Beams", by Norman F. Ramsey, Oxford University Press, 1956, pp. 283–285.

"NBS Monograph, Time and Frequency REB Theory and Fundamentals", A Historical Review of Atomic Frequency Standards, Chp. 4, pp. 85–109, by Roger E. Beehler, 1974.

Frequency Standards and Metrology, A. DeMarchi, editor, Springer-Verlag Berlin, Hesdelberg, 1989, pp. 110–136, 381–386, 391–394.

Primary Examiner—Siegfried H. Grimm
Attorney, Agent, or Firm—Rosen, Dainow & Jacobs

[57] ABSTRACT

A beam tube atomic standard employing optical pumping for state preparation and magnetic state selection of atoms is disclosed. Atoms selected from the group consisting of the alkali metal family (Cesium, Rubidium, Potassium, Sodium and Lithium) are emitted from a source thereof to a state preparation region. A laser by optical pumping changes the state of atoms emitted by the source from a first energy state to a second energy state. A microwave cavity in which a magnetic field is induced receives atoms whose energy state has been changed to the second energy state by the laser, and due to resonance phenomenon changes the state of the atoms in the second energy state. A magnet receives in a gap thereof atoms from the cavity and deflects the received atoms having the changed energy state towards an atomic detector. The atomic detector provides a detection signal proportional to the quantity of atoms received to an oscillator which tunes the frequency of the magnetic field in the cavity in dependence upon the detection signal.

19 Claims, 6 Drawing Sheets

| Tau | Sigma | Uncertain |
|---|---|---|
| 1.0E+02 | 1.308E-12 | 1.39E-14 |
| 2.0E+02 | 9.194E-13 | 1.38E-14 |
| 4.0E+02 | 5.332E-13 | 1.34E-14 |
| 8.0E+02 | 4.533E-13 | 1.36E-14 |
| 1.5E+03 | 3.346E-13 | 1.42E-14 |
| 3.2E+03 | 2.455E-13 | 1.49E-14 |
| 6.4E+03 | 1.669E-13 | 1.43E-14 |
| 1.3E+04 | 1.159E-13 | 1.40E-14 |
| 2.6E+04 | 8.736E-14 | 1.48E-14 |
| 5.1E+04 | 6.889E-14 | 1.62E-14 |
| 1.0E+05 | 4.335E-14 | 1.58E-14 |
| 2.0E+05 | 2.437E-14 | 1.22E-14 |
| 4.1E+05 | 5.882E-15 | 3.59E-15 |

| Tau | Sigma | Uncertain |
|---|---|---|
| 1.0E+02 | 9.915E-13 | 2.12E-14 |
| 2.0E+02 | 6.775E-13 | 2.05E-14 |
| 4.0E+02 | 4.878E-13 | 2.09E-14 |
| 8.0E+02 | 3.454E-13 | 2.09E-14 |
| 1.5E+03 | 2.359E-13 | 2.03E-14 |
| 3.2E+03 | 1.624E-13 | 1.37E-14 |
| 6.4E+03 | 1.222E-13 | 2.10E-14 |
| 1.3E+04 | 7.562E-14 | 1.83E-14 |
| 2.6E+04 | 4.413E-14 | 1.56E-14 |
| 5.1E+04 | 3.632E-14 | 1.82E-14 |
| 1.0E+05 | 1.687E-14 | 1.19E-14 |

10 KHz

100 Hz

ATOMIC FREQUENCY STANDARD USING OPTICAL PUMPING FOR STATE PREPARATION AND MAGNETIC STATE SELECTION OF ATOMS

BACKGROUND OF THE INVENTION

The invention disclosed herein relates generally to atomic standards and a method of providing a frequency and/or time based on an atomic standard, and more particularly to atomic frequency and/or time standards and methods employing a beam tube.

Current commercially-available atomic frequency or time standards typically employ a Cesium beam tube to control the frequency of a crystal-controlled oscillator. Such commercially-available units have a classical Cesium beam tube configuration. The construction and operation of classical Cesium beam tube atomic frequency standards is described, for example, in U.S. Pat. No. 2,972,115 (Zacharias et al.) and in *Molecular Beams*, by Norman F. Ramsey, Oxford University Press, 1956, pp 283-285. The development of atomic frequency standards is described in *NBS Monograph, Time and Frequency REB Theory and Fundamentals*, "A Historical Review of Atomic Frequency Standards", Chapter 4, pages 85-109, by Roger E. Beehler, 1974.

FIG. 1 of the drawings herein shows schematically a classical Cesium ("Cs") beam frequency standard 10 which includes a Cs source (oven) 12, a state preparation or selection region ("A" region) 14, a oscillator 17, a microwave cavity 16, a state selection region ("B" region) 18, and a detector 20. In the classical Cs beam standard, cesium atoms emitted from oven 12 are directed into the gap 24 of the "A" magnet 22. Due to the large gradient of the "A" magnet 22, the cesium atoms in the F=3 and F=4 states are deflected in different directions. In the particular arrangement shown in FIG. 1, the "A" magnet 22 deflects the cesium atoms in the F=3 state to and through the microwave cavity 16 to the "B" magnet 28 The magnetic field in cavity 16 created by microwave oscillations 15 causes some of the Cs atoms in cavity 16 undergo a transition to the F=4 state. The atoms that have undergone a transition from F=3 to F=4 in the cavity 16 are deflected towards the atomic detector 20 by the "B" magnet 28.

The output 26 of detector 20 is coupled to oscillator 17. The detection signal on output 26 of detector 20 varies in accordance with the quantity of Cs atoms that have undergone a transition in the cavity 16, and functions as an error signal for controlling the frequency of oscillator 17.

A Cs beam tube atomic standard employing optical pumping for state preparation and optical pumping for detection has been the subject of investigation for several years. Such optically pumped Cs ("OPCS") beam tube standards employ optical state selection and state detection in the "A" and "B" regions, as well as a microwave cavity and oscillator which may be quite similar to the ones used in the classical Cs beam tube standard described above. In the "A" state preparation region, optical pumping creates a hyperfine population difference. In the "B" region, the resonance phenomenon is detected through fluorescent light variations as a function of the microwave frequency. This fluorescent light variation, which is a direct measure of the number of Cs atoms which have undergone a transition, is detected and used to control the frequency of the microwave oscillations. A number of different pumping schemes are possible which may prepare cesium atoms in either $^2S_{1/2}$, F=3 or F=4 hyperfine states (see the energy level diagram of FIG. 2). Such schemes are well known and described in the literature. The schemes are summarized in Table 1.

TABLE 1

| No. of Lasers | Pump Laser Transition | Probe Laser Transition |
|---|---|---|
| 1 | (F → F') | (F → F') |
|   | 4 → 5* | 4 → 5 |
|   | 4 → 4 | 4 → 4 |
|   | 4 → 3 | 4 → 3 |
|   | 3 → 4 | 3 → 4 |
|   | 3 → 3 | 3 → 3 |
|   | 3 → 2 | 3 → 2* |
| 2 | 4 → 4 | 4 → 5* |
|   | 4 → 3 | 4 → 5* |
|   | 3 → 3 | 3 → 2* |
|   | 3 → 4 | 3 → 2* |
| 3 | 3 → 3 and 4 → 4π | 3 → 2* |
|   | 3 → 4 and 4 → 4π | 3 → 2* |
|   | 4 → 3 and 3 → 3π | 4 → 5* |
|   | 4 → 4 and 3 → 3π | 4 → 5* |

*Cycling transition

As far as applicant is aware, such OPCS beam tube standards are either of the laboratory-type or are in development, and are not commercially available. For example, Frequency Electronics, Inc., the assignee of this application, has been involved in development of a commercial OPCS beam tube standard since 1983, and has produced several prototypes for study and evaluation, which are described in 41st Ann. SFC 59 and 39th Ann. SFC 18, both cited below.

FIG. 3 is a schematic diagram of an OPCS beam tube standard 40. Similar to the classical Cs beam standard 10, the OPCS beam tube standard 40 uses an oscillator 17a and a microwave cavity 16; however, in the "A" state preparation region 14, and in the "B" detection region 18, laser sources 44 and 46 are employed for optical pumping rather than "A" and "B" magnets for state selection. In the OPCS beam tube standard depicted in FIG. 3, different laser sources 44 and 46 are employed. Cs source 12 is axially aligned with the central axis 25 of cavity 16 since laser source 44, unlike a magnet, does not deflect Cs atoms having different states in different directions. Rather, the Cs atoms from source 12 are optically pumped by laser 44 into a hyperfine state in the "A" region 14.

The Cs atoms then enter microwave cavity 16. The magnetic field in cavity 16 created by microwave oscillations 15a causes some of the Cs atoms passing through cavity 16 to undergo a transition as a result of resonance phenomenon.

After leaving cavity 16, Cs atoms enter the "B" region 18, where the resonance phenomenon in cavity 16 is detected through fluorescent light variations as a function of the microwave frequency. This is accomplished by optically pumping Cs atoms back to the hyperfine state, which generates photons and the fluorescence described above.

Fluorescence detector 48 is tuned to detect photon emitted by the Cs atoms as they change their hyperfine state. Fluorescence detector 48 has an output 50 coupled to oscillator 17a. The detection signal on detector output 50 varies in accordance with the detected fluorescence, and functions as an error signal for controlling the frequency of oscillator 17a.

A discussion of optically-pumped beam tube atomic standards may be found in the following published articles: G. Singh, P. Dilavore, C.O. Alley, *IEEE J. Quant. Electr.* QE-7, p. 196, 1971; M. Arditi, J-L Picque, *J. Phys.* 41, pp 6-379, 1980; L. L. Lewis, M. Feldman, *35th Ann. SFC* 612, 1981; A. Derbyshire, R. E. Drullinger, M. Feldman, D. J. Glaze, D. Hillard, D. A. Howe, L. L. Lewis, J. H. Shirly, I. Pascaru, D. Stanciulescu, *39th Ann. SFC* 18, 1985; G. Avila, E. Clerq, M. Labachelerie, P. Cerez, *IEEE Trans. Instr. Meas.* IM-34, p. 139, 1985; T. McClelland, I. Pascaru, J. Zacharski, N. H. Tran, M. Meirs, 41st Ann. SFC 59, 1987; C. Jacques and P. Tremblay, *42nd Ann. SFC*, 1988, pp 505-509; and *Frequency Standards and Metrology*, A. DeMarchi, editor, Springer - Verlag Berlin, Hesdelberg, 1989, pp 110-136, 281-386, 391-394.

The OPCS frequency standard under development by Frequency Electronics, Inc. is described in 41st Ann. SFC 59 and *39th Ann. SFC* 18, both cited above.

Optical pumping is expected to improve the frequency stability and accuracy of Cesium beam frequency standards. For example, as described in 1981 *35th Ann. SFC* 612, cited above, it was believed that optical pumping by laser diodes would increase stability in Cs beam tube standards because optical pumping in the "A" region causes Cs atoms to be converted to the desired hyperfine state rather than being rejected by the magnet, which would provide more atoms for the ultimate detection signal for a given beam intensity. This should provide an improvement in the signal to noise ratio of the standard. The number of levels involved in the optical pumping of Cs in the ground state is 16. With a single laser pumping in the "A" region, Cs atoms will be distributed among nine Zeeman sublevels, with a population distribution of approximately 13% per level. If two lasers are used for optical pumping in "A" region, it is theoretically possible to have a complete population inversion. This corresponds to a significant increase in the intensity of the output signal.

Use of optical pumping in the "B" region relaxes the stringent alignment otherwise necessary for a magnet in the "B" region. Fluorescence detection should have long term stability since all atoms in the beam would be sensed regardless of velocity and position. Also, detection by fluorescence on a state transition produces a large number of photons from each atom of the Cesium beam which should facilitate detection. These also should improve the signal to noise ratio. Optical pumping should also reduce the size of some systematic frequency offsets.

However, the use of optically-pumped state preparation and optically-pumped detection has some drawbacks which have prevented, so far as applicants are aware, full realization of the improvements expected. The intrinsic noise of the optical detector and the shot noise of the stray light are the main limitation factors in achieving the expected improvement in signal to noise ratio. The laser frequency noise is transformed into fluorescence photon noise via the state transition process, and represents another limiting factor in obtaining the expected improved signal to noise ratio. The quality factor ("Q") of the resonance line is less than that in classical Cesium tubes since the velocity selection on the low side of the Maxwellian distribution obtained with a magnetic field does not occur with optical pumping. Also, power and frequency fluctuations of currently available laser diodes degrade the performance of the Cesium beam tube.

Investigation of optically-pumped beam tube standards including studying these limitations and obtaining experimental results has been described in the literature for several years (see, for example, the documents cited above). The literature describes different approaches to diminish these limitations. However, to applicants' knowledge, no commercial optically-pumped beam tube standard is yet available, and to applicants' knowledge, no optically-pumped beam tube standard has achieved the performance eventually expected of optically-pumped beam tube standards.

OBJECTS AND SUMMARY OF THE INVENTION

It is an object of the invention disclosed herein to improve the performance of atomic frequency standards, particularly beam tube standards, and more particularly Cs beam tube standards.

It is another object of the invention to improve the performance of commercial atomic beam tube standards, particularly Cs beam tube standards.

Other objects of the invention are to provide methods for so improving atomic standards, and to provide improved atomic standards.

In pursuing the above and other objects, the applicants concluded that due to the complexity and cost of investigating the drawbacks of optically-pumped beam tube standards described above, and the probable complexity and cost of finding and implementing solutions, it would be some time before a commercial optically-pumped beam frequency standard became available.

The applicants recognized that significant noise in OPCS beam standards, though generated by the laser optical pumping in both the "A" and "B" regions and the intrinsic noise of the fluorescence detector, was optical in nature and therefore difficult to significantly reduce with presently available optical detection schemes. This realization led the applicants to conclude that overall performance of a beam tube standard could be enhanced if optical pumping for state preparation were combined with a detection scheme other than optical fluorescence detection.

According to the invention, applicants selected magnetic field state selection followed by atomic detection. Applicants expected that a beam tube standard utilizing optical pumping for state preparation and magnetic state selection and atomic detection would have the following advantages over a classical beam tube standard and/or an optically-pumped beam tube standard.

The detector output signal would increase by a factor of two over a classical beam tube standard. Instead of being rejected by the "A" region magnet, atoms would be converted by optical pumping to the desired state. By using two lasers, applicants expect the signal intensity to increase significantly as a result of a complete population inversion.

Use of a magnet in the "B" region provides a magnetic velocity selection on the low side of the Maxwellian distribution thereby providing line width comparable to that of a classical beam tube standard and not decreasing the quality factor of the resonance line.

The shot noise due to stray light from the "A" region laser of an optically-pumped beam tube standard does not affect performance in applicants, beam tube standard.

The intrinsic noise of the atomic detector is very low in comparison with the optical detector.

In accordance with the invention, an atomic beam tube apparatus which may be used as a standard is provided which is an improvement over commercial classical beam tube standards. Atoms selected from a metal of the alkali metal family consisting of Cesium, Rubidium, Potassium, Sodium and Lithium are emitted from a source thereof. Emitted atoms are pumped out from a first energy state into a second energy state by optical pumping in the state preparation region ("A" region). The atoms then pass through a microwave cavity, the input of which is fed with a signal which induces the atomic transition for the particular atoms. The atoms that have made the transition in the cavity will change from the second energy state back to the first energy state. A magnetic state selector in the "B" region deflects the atoms that have made the transition in a direction towards an atomic detector. The atoms that did not make the transition in the microwave cavity are deflected in another direction. The quantity of atoms striking the detector is proportional to the quantity which have undergone transitions in the cavity and has a maximum at the transition frequency. The detector provides a detection signal to an oscillator which provides the microwave oscillation signal to the microwave cavity. This detection signal is related (e.g. proportional) to the quantity of atoms striking the detector.

A method of providing a stable frequency source based on an atomic standard in accordance with the invention comprises: emitting atoms selected from a metal of the alkali metal family from a source thereof; pumping out the atoms emitted by the source from a first energy state into a second energy state by optical pumping; changing the energy state of the atoms in a microwave cavity by means of a microwave signal that induces the transition; deflecting the atoms that made the transition in the cavity towards a magnetic state selector in the "B" region and an atomic detector which provides a detection signal related (e.g. proportional) to the transition of atoms in the microwave cavity; using the detection signal to maintain the frequency of the microwave signal on the maximum atomic transition, i.e. to lock the frequency of the oscillator supplying the signal to the microwave cavity to the atomic transition.

In a specific embodiment, optical pumping in the "A" region is provided by a laser, preferably a laser diode. In one embodiment, two lasers, preferably laser diodes, are provided for optical pumping in the "A" region for a complete population inversion and therefore an improved signal to noise ratio at the output of the atomic detector.

In a specific embodiment, the magnetic field gradient in the "B" region is provided by a permanent magnet.

In the preferred embodiment, the apparatus is a cesium beam tube standard in which optical pumping in the "A" region is provided by at least one laser, and preferably two lasers, preferably laser diodes, and the magnetic field gradient in the "B" region is provided by a permanent magnet. In the preferred embodiment, the cesium atoms are emitted by a cesium oven, and cesium atoms are optically pumped by the at least one laser into the F=3 ground state. The microwave frequency into the cavity is tuned to the resonant frequency of cesium (9.192+ GHz) in order to induce the transition of the cesium atoms from F=3 to F=4 ground state. The magnet in the "B" region then deflects cesium atoms in the F=4 ground state to an atomic detector. However, other state transition schemes may be used.

The above and other objects, aspects, features and advantages of the invention will be more readily perceived from the description of the preferred embodiments thereof taken in conjunction with the accompanying drawings and appended claims.

BRIEF DESCRIPTION OF THE DRAWINGS

The invention is illustrated by way of example and not limitation in the figures of the accompanying drawings in which like references denote the same or corresponding parts, and in which:

FIGS. 5–8 are plots illustrating the stability performance of the Cs beam tube standard of FIG. 4, more particularly, FIG. 5 shows the measured frequency offset of the Cs beam tube standard of FIG. 4, FIGS. 6A and 7A show the measured Allan standard deviation of the Cs beam tube standard of FIG. 4, FIGS. 6B and 7B are tables sharing the values plotted in FIGS. 6A and 7A, respectively and FIG. 7 shows the measured time residual of the Cs beam tube standard of FIG. 4;

DESCRIPTION OF THE PREFERRED EMBODIMENTS

Figure 1:
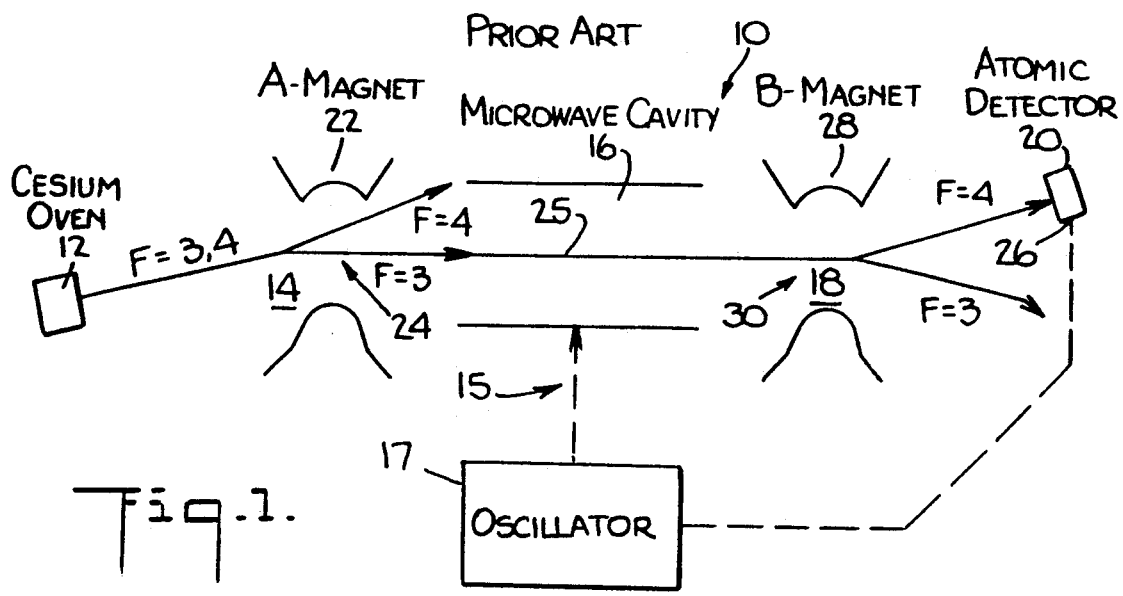
FIG. 1 is a schematic diagram of a representative prior art classical Cs beam tube standard.
Figure 2:
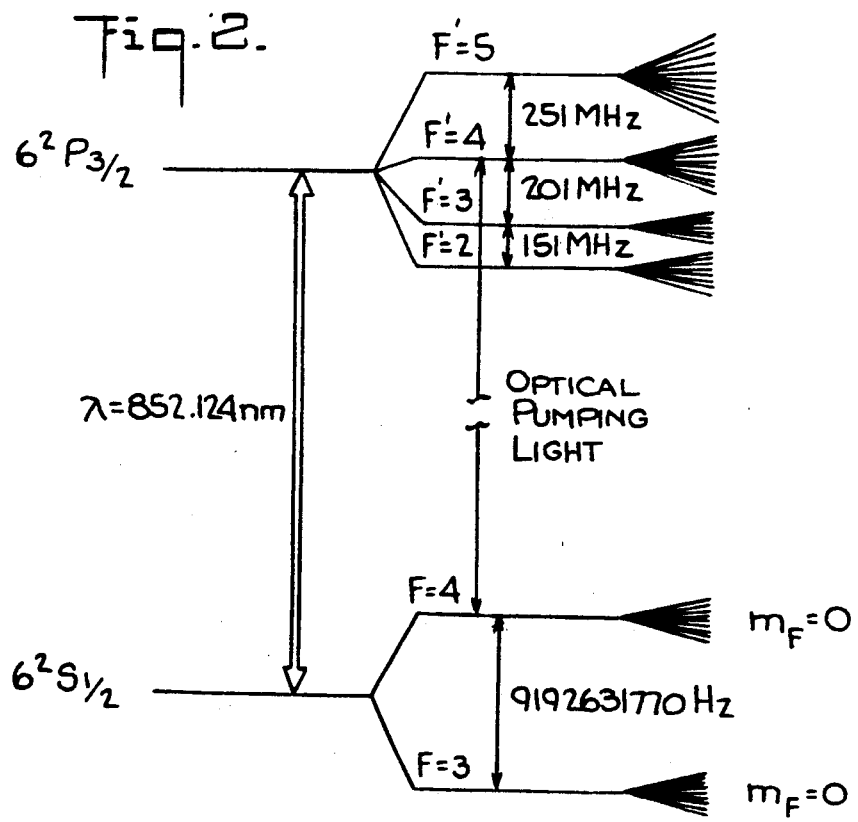
FIG. 2 is an energy level diagram showing various energy levels for Cesium atoms and the transitions therebetween achievable with optical pumping.
Figure 3:
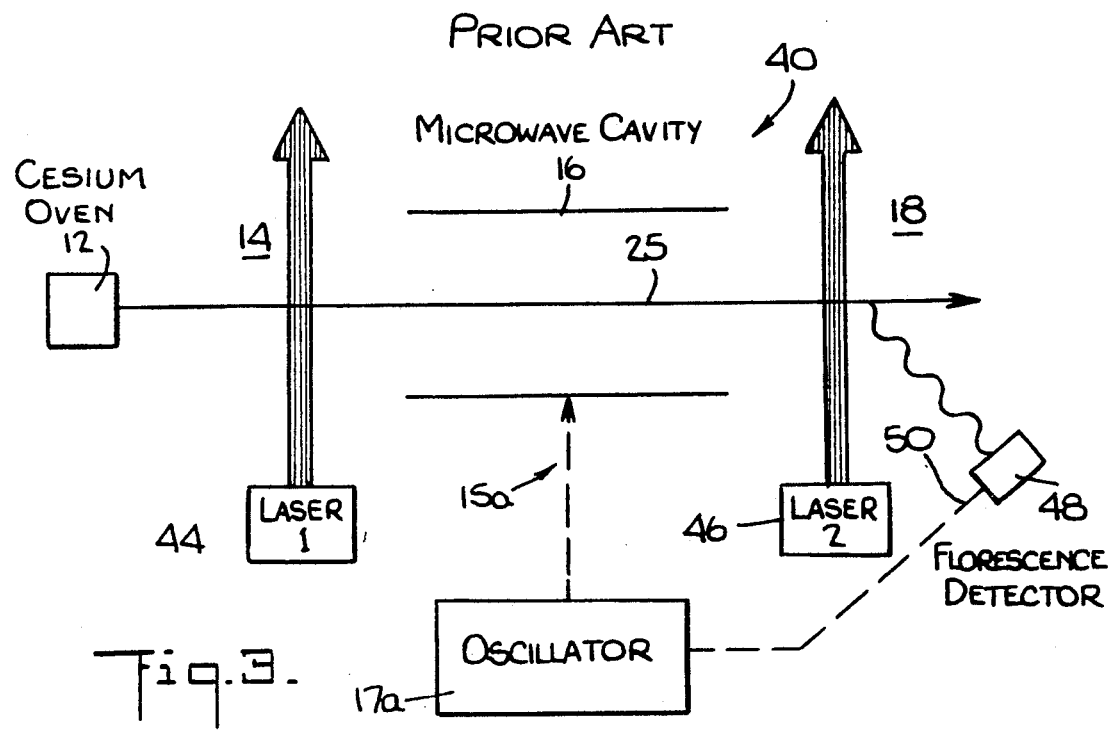
FIG. 3 is a schematic diagram of a representative prior art OPCS beam tube standard employing optical pumping for state preparation and detection.
Figure 4:
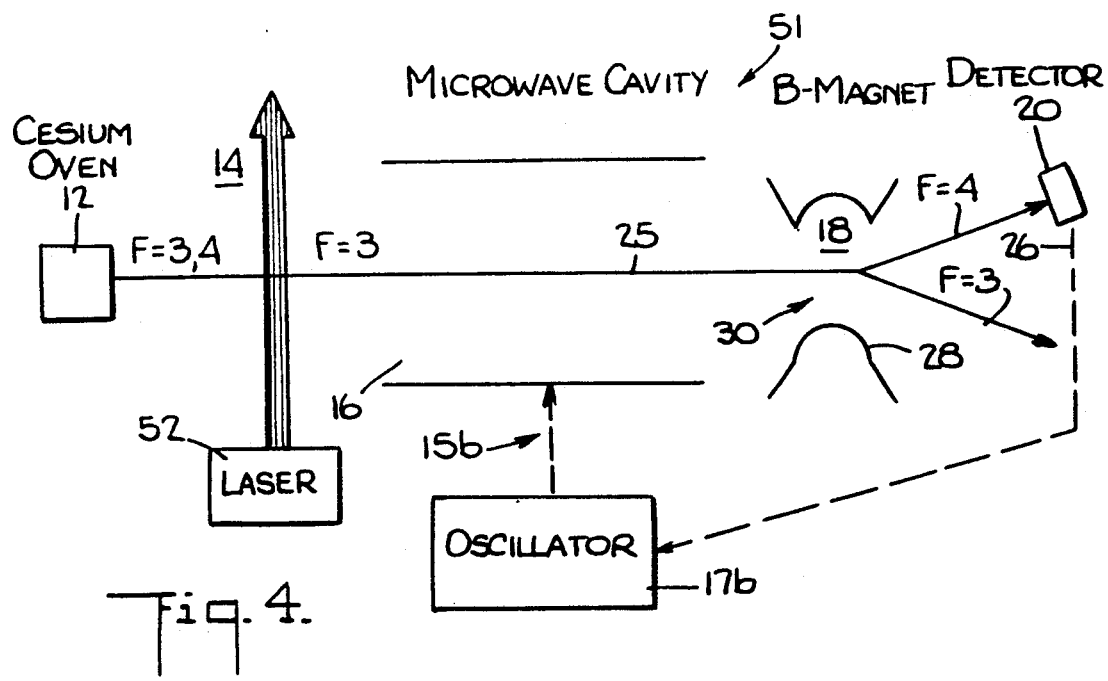
FIG. 4 is a schematic diagram of a OPMS Cs beam tube standard incorporating the invention.

Referring to FIG. 4, OPMS Cesium beam tube standard 51 employing optically-pumped state preparation and magnetic state selection and atomic detection in accordance with the invention comprises a Cs oven (source) 12, a laser diode 52 for optically pumping Cs atoms emitted by oven 12, a microwave cavity 16, an oscillator 17b, a magnet 18 and an atomic detector 20. Cs oven 12, cavity 16, oscillator 17b, magnet 28 and atomic detector 20 may be essentially the same as the corresponding components in Frequency Electronics, Inc.'s ("FEI") commercially-available Model 5440A Cs classical beam tube standard, and laser diode 52 is a standard laser diode commercially available from Mitsubishi Electric Co. as type ML-2701.

Standard laser diode 52 is disposed with its axis perpendicular to both the cesium beam and the constant magnetic field (C-Field) which is present in the microwave cavity. In order to stabilize the laser diode frequency, the temperature and the current of the laser are electronically stabilized in known manner. In addition the laser current is servo-locked in know manner to the optical transition of the cesium beam itself.

Referring to FIG. 4, laser diode 52 is tuned to the $(^2S_{\frac{1}{2}} \cdot F=4) \longleftrightarrow (^2P_{3/2} \cdot F'=4)$ transition (852 mm) from the ground state to the second excited state. The Cs atoms decay back to both the F=3 and F=4 ground state levels with approximately equal probability. After sufficient exposure to the laser light all the atoms from F=4 ground state will be optically pumped into the F=3 ground state. The Cs atoms in the F=3 ground state are than directed into cavity 16 where the microwave magnetic field created by oscillations 15b at a frequency of 9.192+ GHz induces a transition of atoms from F=3 to F=4 ground state. Magnet 18 then deflects and focuses the Cs atoms in the F=4 ground state on atomic detector 20. Detector 20 provides a detection signal on its output 26 which functions as an error signal and is supplied to oscillator 17b to control its frequency of oscillation similar to the manner for the FEI Model 5440 classical Cs beam standard.

The signal to noise ratio measured for OPMS Cs standard 51 was 63 dB in a 1Hz bandwidth. The line width of the resonance line at half intensity was measured to be 550Hz, which is similar to the line width of the FEI Model 5440A classical Cs beam standard.

The estimated short term stability of an atomic frequency standard is given by:

$$\sigma(\tau) \simeq 0.2 \frac{\Delta f}{f_o} \times \frac{1}{s/n} \times \frac{1}{\sqrt{\tau}} \quad (1)$$

Where:

$\sigma(\tau)$ = Allan variance (standardized measurements of short term stability);
$\Delta f$ = linewidth of the resonance line;
$s/n$ = signal to noise ratio in 1 Hz bandwidth
$\tau$ = averaging time of stability measurements
$f_o$ = resonance frequency of the atomic hyperfine transition.

Using the experimental results obtained from the OPMS Cs standard 51, the estimated short term frequency stability from equation (1) is:

$$\sigma(\tau) \simeq 1 \times 10^{-11}/\sqrt{\tau}$$

Figure 5:
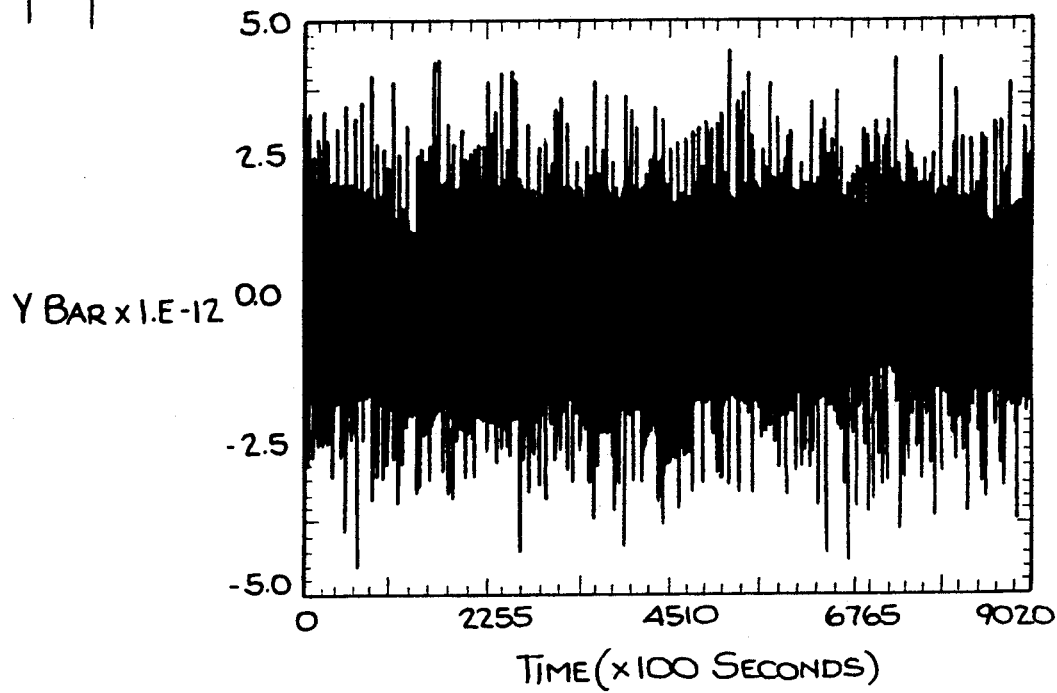
Figure 6:
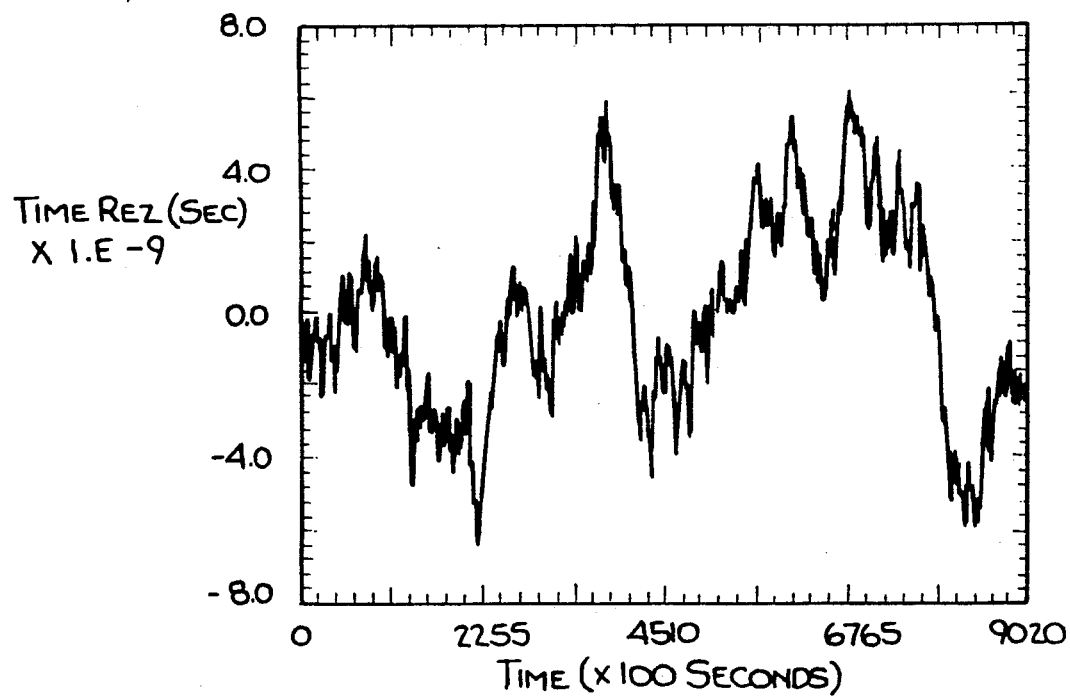
Figures 6A, 6B:
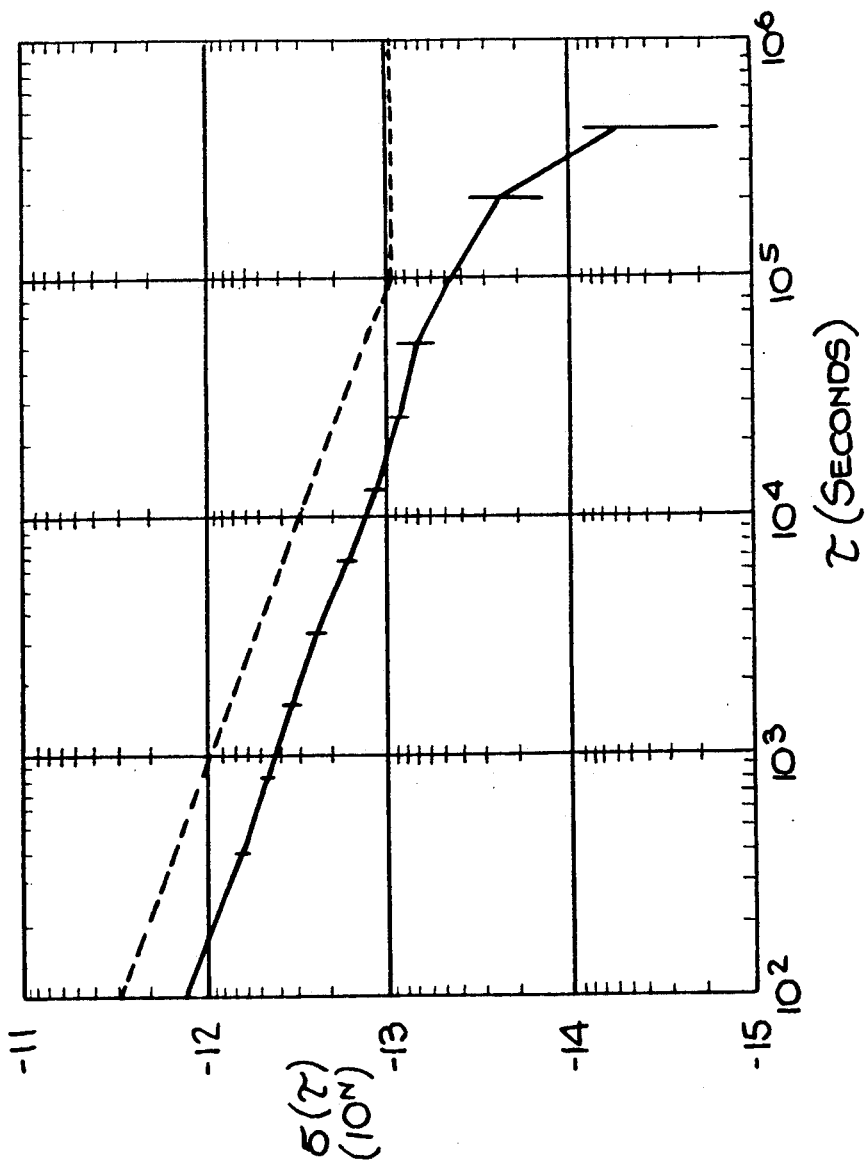
Figures 7A, 7B:
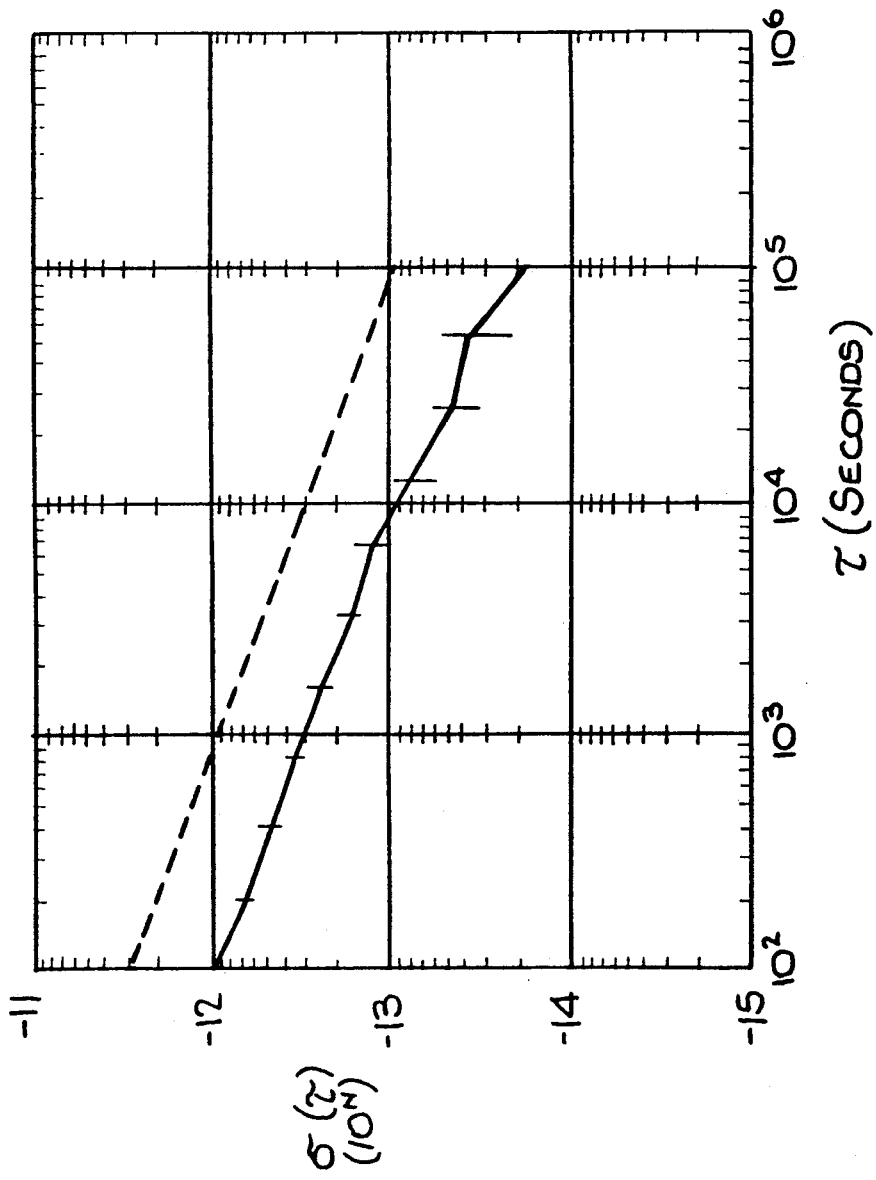
Figure 9:
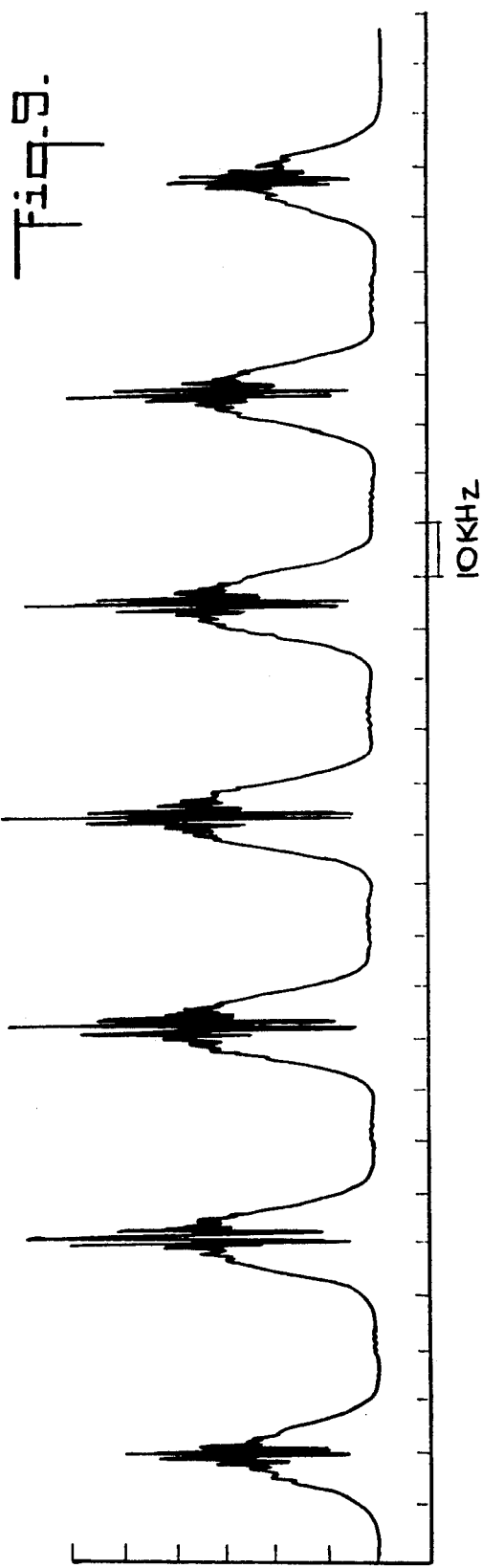
FIG. 9 is a plot of the full frequency spectrum of the OPMS Cs beam tube standard of FIG. 4.
Figure 10:
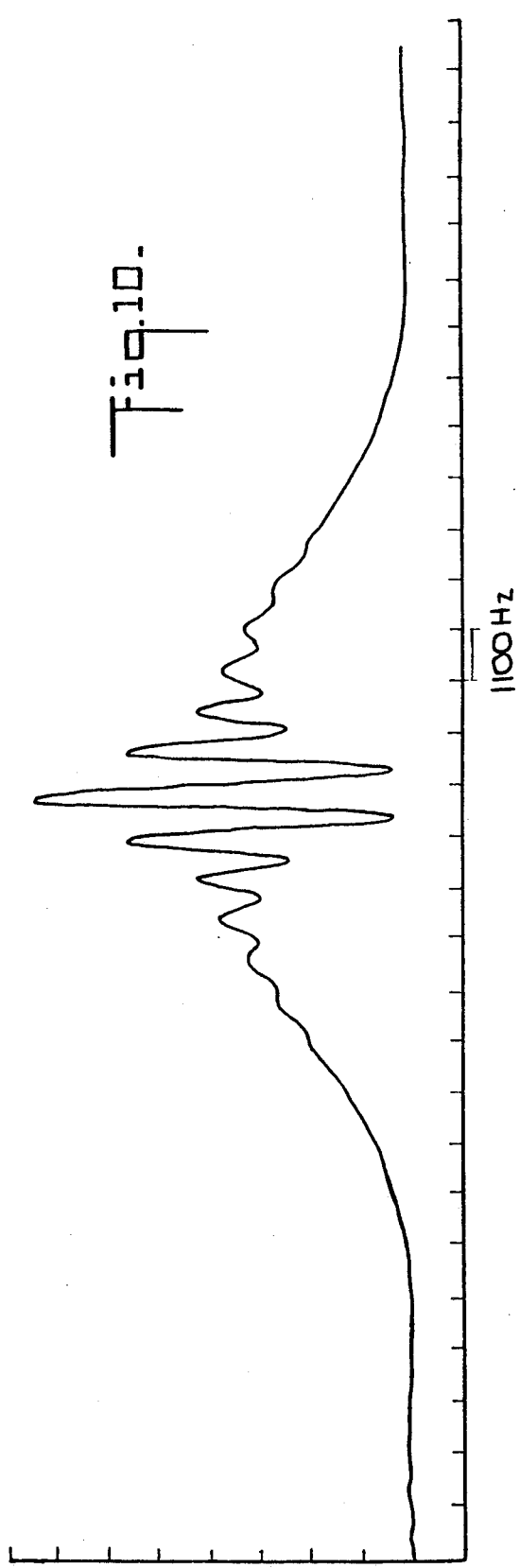
FIG. 10 is a plot of the central Ramsey pattern of the frequency spectrum depicted in FIG. 9.

The measured short term stabilities plotted using the values in FIGS. 6B and 7B in FIGS. 6A and 7A, respectively, (for a sampling rate of $\tau$ for different FIG. 4 Cs beam tube standards versus a reference measured over a 10-day period) were between $1 \times 10^{-11}/\sqrt{\tau}$ and $1.5 \times 10^{-11}/\sqrt{\tau}$. The long term stability (linear drift for sampling rate of $\tau = 100$ seconds of the OPMS Cs standard 51 versus a reference measured over a 10-day period) is shown in FIG. 5 and the associated time residuals are shown in FIG. 8. The Ramsey patterns of the microwave transitions shown in FIG. 9 for the full microwave spectrum for OPMS Cs standard 51 are well resolved and are centered on their Rabi pedestal. This indicates a good magnetic field uniformity along the atomic beam path in the microwave interaction region. The central resonance of FIG. 10 for the expanded microwave spectrum for the OPMC Cs standard 51 shows the signal and the line width obtained with the OPMS Cs standard 51.

Certain changes and modifications of the embodiments of th invention herein disclosed will be readily apparent to those of skill in the art. Moreover, uses of the invention other than in frequency/time standards will also be readily apparent to those of skill in the art. It is the applicants, intention to cover by the claims all such uses and all those changes and modifications which could be made to the embodiments of the invention herein chosen for the purposes of disclosure which do not depart from the spirit and scope of the invention.

What is claimed is:

1. An atomic beam tube apparatus which may be used as a standard, said apparatus comprising:
   a source of atoms for emitting atoms selected from the group consisting of the alkali metal family; first means for changing atoms emitted by said source from a first energy state to a second energy state by optical pumping in a state preparation region of said apparatus;
   a tunable oscillator and a microwave cavity, said oscillator providing a signal to said microwave cavity;
   said first means and said cavity being disposed so that said cavity receives atoms whose energy state has been changed to said second energy state by said first means in said state preparation region; said oscillator providing said signal to said cavity at a resonance frequency of said cavity to provide microwave energy to said cavity which is operative to change the state of said atoms in said cavity in said second energy state;
   second means receiving atoms form said cavity for deflecting in a first direction with a magnetic field in a detection region of said apparatus said received atoms having said second energy state, and in a second direction different form said first direction said received atoms having said changed energy state; means for detecting atoms deflected in one of said two directions by said second means, said means for detecting providing a detection signal related to detection by said means for detecting of said atoms deflected in said one direction;
   said detection signal being coupled to said oscillator, and said oscillator tuning the frequency of said signal provided to said cavity in dependence upon said detection signal.

2. The apparatus of claim 1 wherein said first means comprises a laser.

3. The apparatus of claim 1 wherein said first means comprises at least one laser diode.

4. The apparatus of claim 1 wherein said first means comprises two laser diodes.

5. The apparatus of claim 1 wherein said second means comprises a magnet.

6. The apparatus of claim 1 wherein said first means comprises a laser and said second means comprises a magnet.

7. The apparatus of claim 1 wherein said first means comprises at least one laser diode and said second means comprises a magnet.

8. The apparatus of claim 1 wherein said source is a source of Cesium atoms.

9. An atomic beam tube apparatus which may be used as a standard, said apparatus comprising:
   a source of atoms for emitting atoms selected from the group consisting of the alkali metal family;
   a laser for changing atoms emitted by said source from a first energy state to a second energy state by optical pumping in a state preparation region of said apparatus;
   a tunable oscillator and a microwave cavity, said oscillator providing a signal to said microwave cavity;
   said laser and said cavity being disposed so that said cavity receives atoms whose energy state has been changed to said second energy state by said laser in said state preparation region; said oscillator providing said signal to said cavity at a resonance frequency of said cavity to provide microwave energy to said cavity which is operative to change the state of said atoms in said cavity in said second energy state;

a magnet disposed in a detection region of said apparatus for receiving in a gap thereof atoms from said cavity and deflecting said received atoms having said second energy state in a first direction and said received atoms having said changed energy state in a second direction different from said first direction;

means for detecting atoms deflected in said second direction by said magnet; said means for detecting providing a detection signal related to detection by said means for detecting of said atoms deflected in said second direction;

said detection signal being coupled to said oscillator, and said oscillator tuning the frequency of said signal provided to said cavity in dependence upon said detection signal.

10. The apparatus of claim 9 wherein said laser comprises at least one laser diode.

11. The apparatus of claim 9 wherein said laser comprises two laser diodes.

12. A Cesium atomic beam tube apparatus which may be used as a standard, said apparatus comprising:

a source of Cesium atoms for emitting Cesium atoms;

a laser for changing Cesium atoms emitted by said source from a first energy state to a second energy state by optical pumping in a state preparation region of said apparatus;

a tunable oscillator and a microwave cavity, said oscillator providing a signal to said microwave cavity;

said laser and said cavity being disposed so that said cavity receives Cesium atoms whose energy state has been changed to said second energy state by said laser in said state preparation region, said oscillator providing said signal to said cavity at a resonance frequency of said cavity to provide microwave energy to said cavity which is operative to change the state of said Cesium atoms in said cavity in said second energy state;

a magnet disposed in a detection region of said apparatus for receiving in a gap thereof Cesium atoms from said cavity and deflecting said received Cesium atoms having said second energy state in a first direction and said received Cesium atoms having said changed energy state in a second direction different from said first direction;

means for detecting Cesium atoms deflected in said second direction by said magnet; said means for detecting providing a detection signal related to detection by said means for detecting of said Cesium atoms deflected in said second direction;

said detection signal being coupled to said oscillator, and said oscillator tuning the frequency of said signal provided to said cavity in dependence upon said detection signal.

13. The apparatus of claim 12 wherein said laser comprises at least one laser diode.

14. The apparatus of claim 12 wherein said laser comprises two laser diodes.

15. A method of providing a signal having a frequency based on an atomic standard, said method comprising:

emitting atoms selected from the group consisting of the alkali metal family from a source thereof;

changing the state of atoms emitted by said source from a first energy state to a second energy state by optical pumping;

changing the energy state in a microwave cavity of said atoms in said second energy state to a changed energy state by means of a magnetic field provided by a tunable oscillator feeding said cavity;

deflecting said atoms in said second energy state in a first direction and said atoms having said changed energy state in a second direction different from said first direction with a magnetic field; and detecting atoms deflected in one of said two directions and providing a detection signal related to said detection to said oscillator for tuning said magnetic field in dependence upon said detection signal.

16. The method of claim 15 wherein said atoms are Cesium atoms.

17. A method of providing a signal having a frequency based on an atomic standard, said method comprising:

emitting atoms selected from the group consisting of the alkali metal family from a source thereof;

changing the state of atoms emitted by said source from a first energy state to a second energy state by optical pumping with at least one laser;

changing the energy state in a microwave cavity of said atoms in said second energy state to a changed energy state by means of a magnetic field in said cavity;

deflecting said atoms in said second energy state in a first direction and said atoms having said changed energy state in a second direction different from said first direction with a magnetic field provided by a magnet; and detecting atoms deflected in one of said two directions and providing a detection signal related to said detection to tune said magnetic field in dependence upon said detection signal.

18. The method of claim 17 wherein said atoms are Cesium atoms.

19. A method of providing a signal having a frequency based on an atomic standard, said method comprising:

emitting Cesium atoms from a source thereof;

changing the state of Cesium atoms emitted by said source from a first energy state to a second energy state by optical pumping with at least one laser;

changing the energy state in a microwave cavity of said Cesium atoms in said second energy state to a changed energy state by means of a magnetic field induced in said cavity by a tunable oscillator coupled to said cavity;

deflecting said Cesium atoms in said second energy state in a first direction and said Cesium atoms having said changed energy state in a second direction different from said first direction with a magnetic field provided by a magnet; and detecting Cesium atoms deflected in one of said two directions and providing a detection signal related to said detection to said oscillator to tune said oscillator to induce said magnetic field in dependence upon said detection signal.

* * * * *